(12) United States Patent
Lew et al.

(10) Patent No.: US 7,971,836 B2
(45) Date of Patent: Jul. 5, 2011

(54) SUPPORTING TABLE HAVING HEATERS INSIDE CRYSTAL-GROWING FURNACE

(75) Inventors: Shiow-Jeng Lew, Taipei (TW); Hur-Lon Lin, Taipei (TW)

(73) Assignee: Green Energy Technology Inc. (TW)

( * ) Notice: Subject to any disclaimer, the term of this patent is extended or adjusted under 35 U.S.C. 154(b) by 590 days.

(21) Appl. No.: 12/155,031

(22) Filed: May 29, 2008

(65) Prior Publication Data

US 2009/0173275 A1    Jul. 9, 2009

(30) Foreign Application Priority Data

Jan. 3, 2008   (TW) .............................. 97100178 A

(51) Int. Cl.
*A47B 91/00* (2006.01)
*C30B 15/00* (2006.01)
*H05B 3/62* (2006.01)

(52) U.S. Cl. ..................... 248/188.7; 117/217; 117/215; 248/635; 373/128; 373/129

(58) Field of Classification Search .................. 248/200, 248/118.7, 176.2, 440, 632–634, 644, 188.7; 117/206, 215, 216, 217, 218; 373/110, 117, 373/118, 119, 128, 129, 130
See application file for complete search history.

(56) References Cited

U.S. PATENT DOCUMENTS

| | | | | |
|---|---|---|---|---|
| 3,004,090 A | * | 10/1961 | Donovan et al. | 373/110 |
| 3,395,241 A | * | 7/1968 | Roman | 373/128 |
| 4,510,069 A | * | 4/1985 | Eidenschink et al. | 252/299.61 |
| 5,414,927 A | * | 5/1995 | Fiel et al. | 373/110 |
| 7,604,698 B2 | * | 10/2009 | Lew et al. | 117/206 |
| 2009/0173275 A1 | * | 7/2009 | Lew et al. | 117/200 |
| 2009/0188426 A1 | * | 7/2009 | Lew et al. | 117/206 |
| 2009/0211519 A1 | * | 8/2009 | Lew et al. | 117/217 |

* cited by examiner

Primary Examiner — Tan Le
(74) Attorney, Agent, or Firm — Bacon & Thomas, PLLC

(57) ABSTRACT

A supporting table having heaters inside a crystal-growing furnace includes a table plate and a plurality of supporting posts, wherein the supporting posts support the table plate and are, respectively, electrically connected with the heaters. Each supporting post includes, among others, a graphite electrode post, a metal electrode post, and an anchoring base. The supporting posts are each with its graphite electrode post screwed to a nut portion of the metal electrode post, and with the metal electrode post fixed to a wall of the crystal-growing furnace. The anchoring base includes, among others, a flange and an elastic washer, where the flange is welded to the wall of the furnace, and with the help of elasticity adjustment of the elastic washer, the supporting table can bear an equal distribution of loading from the supporting posts. To distribute weight of the supporting table and to stably secure the supporting table on the wall of the crystal-growing furnace will make a crucible in the furnace not easy to fall down so as to avoid incurring of public casualty. Further, to thin the table plate of the supporting table will facilitate a uniform transfer of heat to the crucible, and will facilitate a uniform crystal growth for silicon slurry when the crucible is cooled.

18 Claims, 6 Drawing Sheets

SUPPORTING TABLE HAVING HEATERS INSIDE CRYSTAL-GROWING FURNACE

BACKGROUND OF THE INVENTION

1. Field of the Invention

The present invention relates to a supporting table, more particularly, to a supporting table, having heaters, adapted for a crystal-growing furnace.

2. Description of Related Art

Referring to FIG. 1, a schematic view illustrating a conventional crystal-growing furnace, a heating room 90 is provided inside the furnace 9 where a table plate 91 and a crucible 92 are arranged inside the heating room 90, wherein the crucible 92 contains silicon material. Supporting posts 93 are fixed to a lower body 94 of the crystal-growing furnace 9, and are supportively arranged underneath the table plate 91 and the crucible 92.

Suppose the table plate 91 may be arranged in the conventional crystal-growing furnace 9 in a balanced manner, three supporting posts 93 are used for this purpose. Nevertheless, to effectively sustain the crucible 92 with the three supporting posts 93, the table plate 91 needs to be significantly thick so as to avoid fracture thereof. Likewise, each supporting post 93 has to be relatively large in order to bear the loading.

As shown in FIG. 1, heaters 95 are arranged around the crucible 92 so as to heat the silicon material through radiant heat. During a heating process, since the table plate 91 has a greater heat capacity, a great deal of heat has to be absorbed in order to gradually melt, and when reaching a predetermined temperature, completely melt the silicon material into molten silicon slurry. And during a cooling process for crystal growth, since cooling for the table plate 91 is difficult, and since the silicon slurry in the crucible 92 cannot be cooled uniformly at the lower and the upper portions of the crucible 92, inner stress will incur, after the silicon slurry has been solidified and turned into crystal ingots, resulting in undesirable quality of products.

Further, in case the silicon slurry leaks out from slits of the crucible 92, molten silicon slurry will be accumulated continuously and thus erodes the supporting posts 93, making the supporting posts 93 fractured and the crucible 92 fall down, and eventually, a public casualty occurs.

SUMMARY OF THE INVENTION

The present invention is to provide a supporting table having heaters inside a crystal-growing furnace, comprising a table plate and at least four supporting posts, wherein the table plate is supported by and fixed to the wall of a lower body of the crystal-growing furnace by the supporting posts.

According to the present invention, the supporting table further comprises a plurality of electric heaters disposed, respectively, beneath the table plate. Each supporting post includes a graphite electrode post, a metal electrode post, an anchoring base, a plurality of bolts, and a locking nut.

The graphite electrode post has a bottom end and a top end. The bottom end is provided with an external thread. The top end supports one of the heaters against underneath of the heater so as to establish an electric connection therebetween. The metal electrode post includes a nut portion and a thread portion. The nut portion is, at one end, provided with a recessed internal thread hole for threading engagement, correspondingly, with the external thread of the graphite electrode post. The nut portion extends, at the other end, the thread portion and forms, together with the thread portion, a shoulder portion.

The anchoring base includes a flange, an insulating seal, an upper insulating pad, a sealing washer, an elastic washer, a ring, and a plurality of insulating rings. The flange has a cylindrical portion and an external circular portion, wherein the cylindrical portion is, at periphery, welded to a wall of the lower body of the furnace, such that a central hole is formed in the cylindrical portion. The external circular portion is provided with a plurality of through holes.

The insulating seal is sleeved to the nut portion of the metal electrode post, which are then received together into the central hole. The upper insulating pad has a central hole and is provided with a plurality of circular holes alone circumference thereof. The sealing washer has a central hole and is, circumferentially, provided with a plurality of passing holes.

The elastic washer includes a center portion, a circumference portion, and at least one elastic piece which is interconnected with and between the center portion and the circumference portion so as to provide an elastic force in an axial direction. The center portion is provided, at center, a central hole, and that the circumference portion with a plurality of through holes.

The thread portion of the metal electrode post extends through the central hole of the sealing washer and the central hole of the elastic washer, with the shoulder portion abutting the sealing washer. The ring is, circumferentially, provided with a plurality of fixing holes.

Further, in the present invention, there are provided with a plurality of bolts extending, correspondingly, through the plural fixing holes, the plural insulating rings, the plural through holes, the plural passing holes, the plural circular holes, and the plural extending holes. With the help of plural nuts, the upper insulating pad, the sealing washer and the elastic washer are clamped together and fastened in between the flange and the ring, wherein electric insulation is established between the flange and the sealing washer attributed to the insulating seal, the upper insulating pad, and the plural insulating rings.

The locking nut is screwed to the thread portion of the metal electrode post, and is provided for clamping the sealing washer and the elastic washer in between the locking nut and the shoulder portion of the metal electrode post.

Therefore, with the help of elasticity adjustment of the elastic washer, the supporting table can bear an equal distribution of loading from the supporting posts, making increase of the number of the supporting posts become immaterial. To distribute the weight of the supporting table and to stably secure the supporting table on the wall of the lower body of the crystal-growing furnace will make the crucible not easy to fall down so as to avoid incurring of public casualty. Further, to thin the table plate of the supporting table so as to reduce the heat capacity thereof, the heater arranged beneath the table plate can therefore uniformly and directly transfer neat to the crucible. In contrast, when the crucible is cooled, the crucible can achieve a more effective cooling at the bottom. This not only facilitates a uniform crystal growth for the silicon slurry, but also saves consumption of energy.

According to the present invention, an insulating bias piece is disposed between the heater and the table plate, where the insulating bias piece corresponds, downward, to the top of the graphite electrode post. Besides, the heater is provided, at both sides, with a first receiving recess, respectively. A plurality of second receiving recesses are provided underneath of the table plate, and that the insulating bias piece is received in the first receiving recess and the second receiving recess which corresponds to the first receiving recess, such that the table plate and the heater can be held stably. The insulating bias piece is made of zirconium oxide, or of any other equivalents of high-temperature resistant and insulating materials.

The table plate of the supporting table is provided, underneath, a central recess, such that the supporting table is thinner in the center, not only increasing efficiency of heating for the heater, but also making the crystal-growing cooling process beginning from the center of the bottom of the crucible and then crystal-growth proceeds upward and outward uniformly. This will avoid incurring of inner stress.

The graphite electrode post is provided, at a top end, with an external thread. The graphite electrode post is also provided with an adjusting nut. Through threading engagement of the adjusting nut with the external thread, the heater is supported. The adjusting nut is provided not only for adjusting horizontal degree of the supporting table, but also for enlarging contacting area of electrical connection.

Further, according to the present invention, the adjusting nut refers to a graphite adjusting nut. The metal electrode post refers to a copper electrode post. The flange is provided, underneath, with a protrusion ring, and that the upper insulating pad is provided, on the top, with an annular recess, where the protrusion ring is inserted into the annular recess so as to effect an anchoring action and to stop a relative sliding between the flange and the upper insulating pad. The flange is made of stainless steel. The insulating seal is made of alumina fiber. The upper insulating pad is made of silicon rubber or Teflon.

Still further, the upper insulating pad is provided, circumferentially, with a flange for sealing with the ring and for enhancing insulating effectiveness. The sealing washer refers to a copper washer. The anchoring base further includes a lower insulating pad interposed between the elastic washer and the ring. The lower insulating pad is provided, circumferentially, with a plurality of holes. The supporting table may further include a plurality of insulating seals and of insulating caps which are covered, correspondingly, on a plurality of nuts or on heads of a plurality of bolts, respectively, such that water drips can be prevented from entering into gaps between the bolts and the flange, and that a desirable insulation effect can be obtained.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
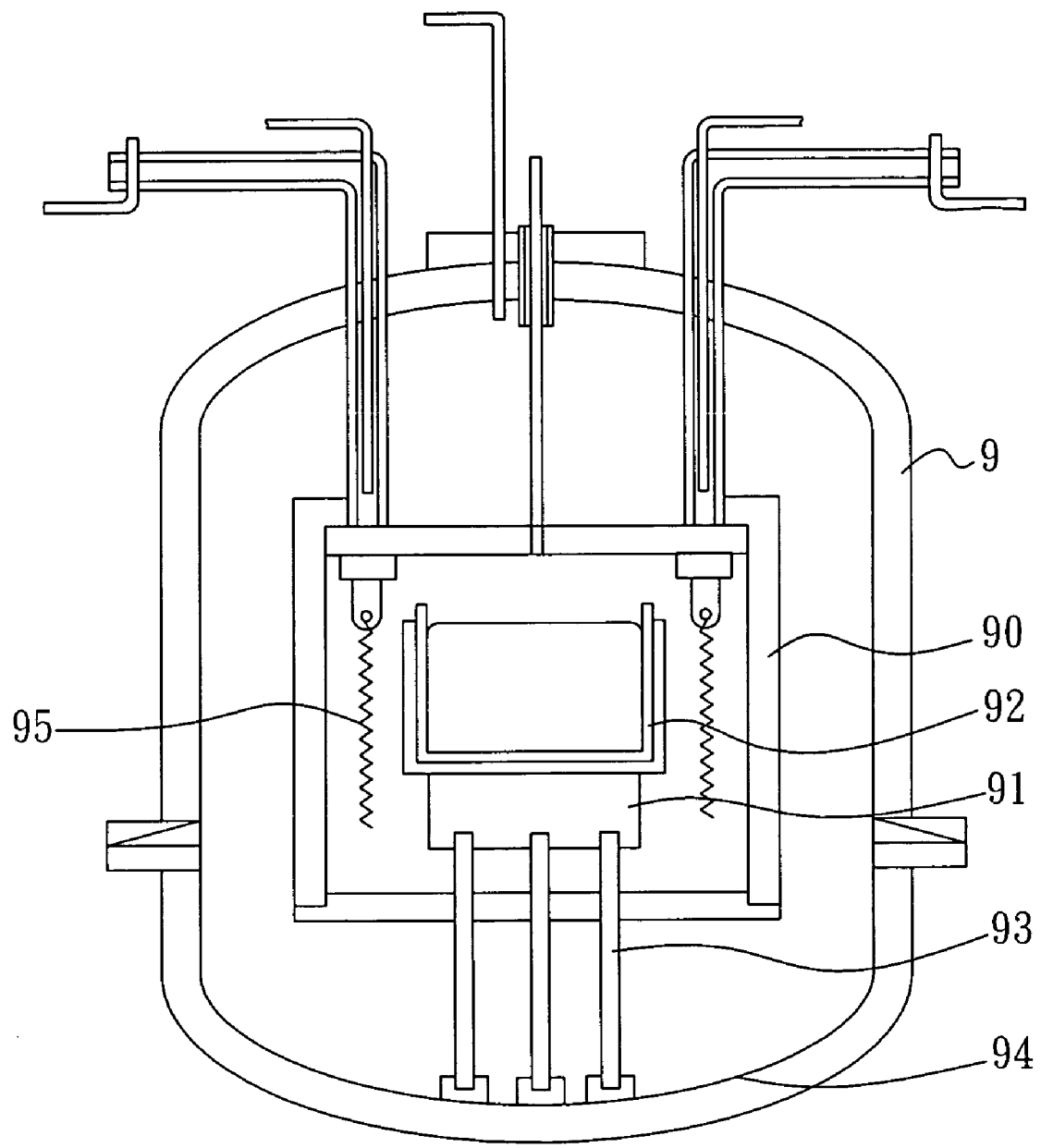
FIG. 1 is a schematic view illustrating a conventional crystal-growing furnace.
Figure 2:
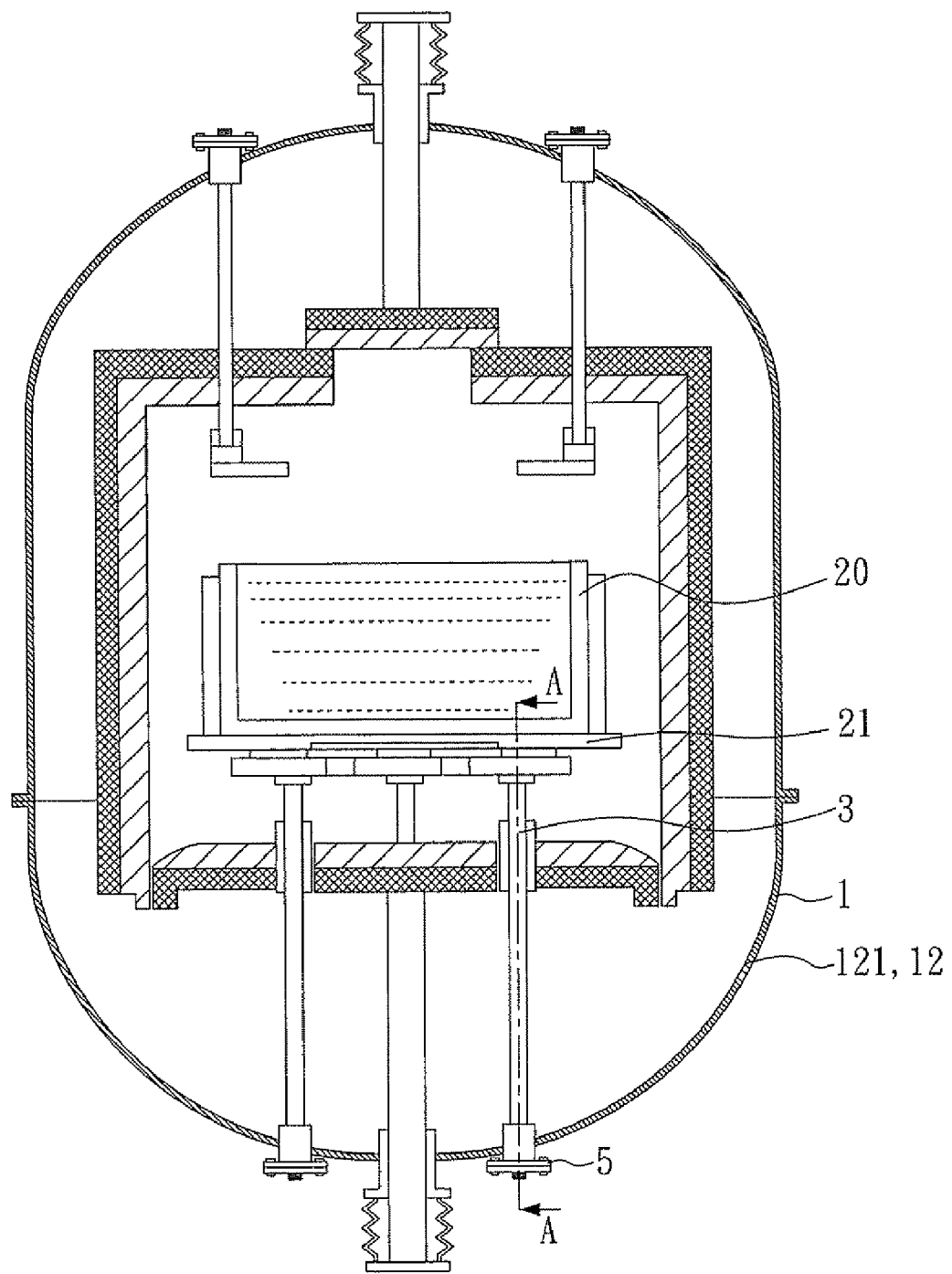
FIG. 2 is a cross-sectional view illustrating a crystal-growing furnace according to the present invention.

Referring to FIG. 2, a cross-sectional view illustrating a crystal-growing furnace according to the present invention, a supporting table having heaters inside the crystal-growing furnace comprises a table plate 21 and eight supporting posts 3, wherein the table plate 21 is supported by and fixed to the wall 121 of a lower body 12 of the crystal-growing furnace 1.

Figure 3:
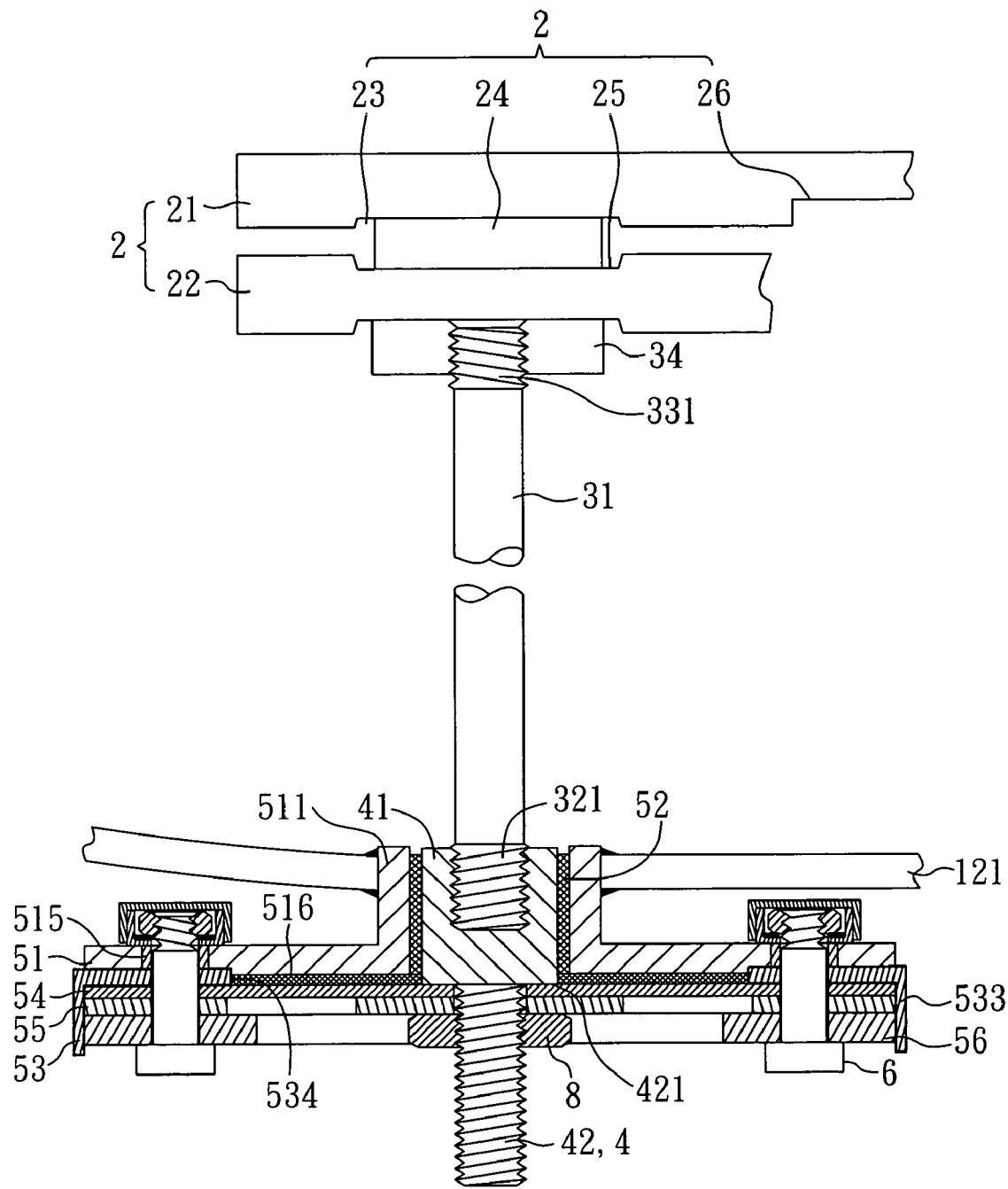
FIG. 3 is a cross-sectional view illustrating a supporting table inside the crystal-growing furnace taken along lines A-A in FIG. 2 according to a first embodiment of the present invention.
Figure 4:
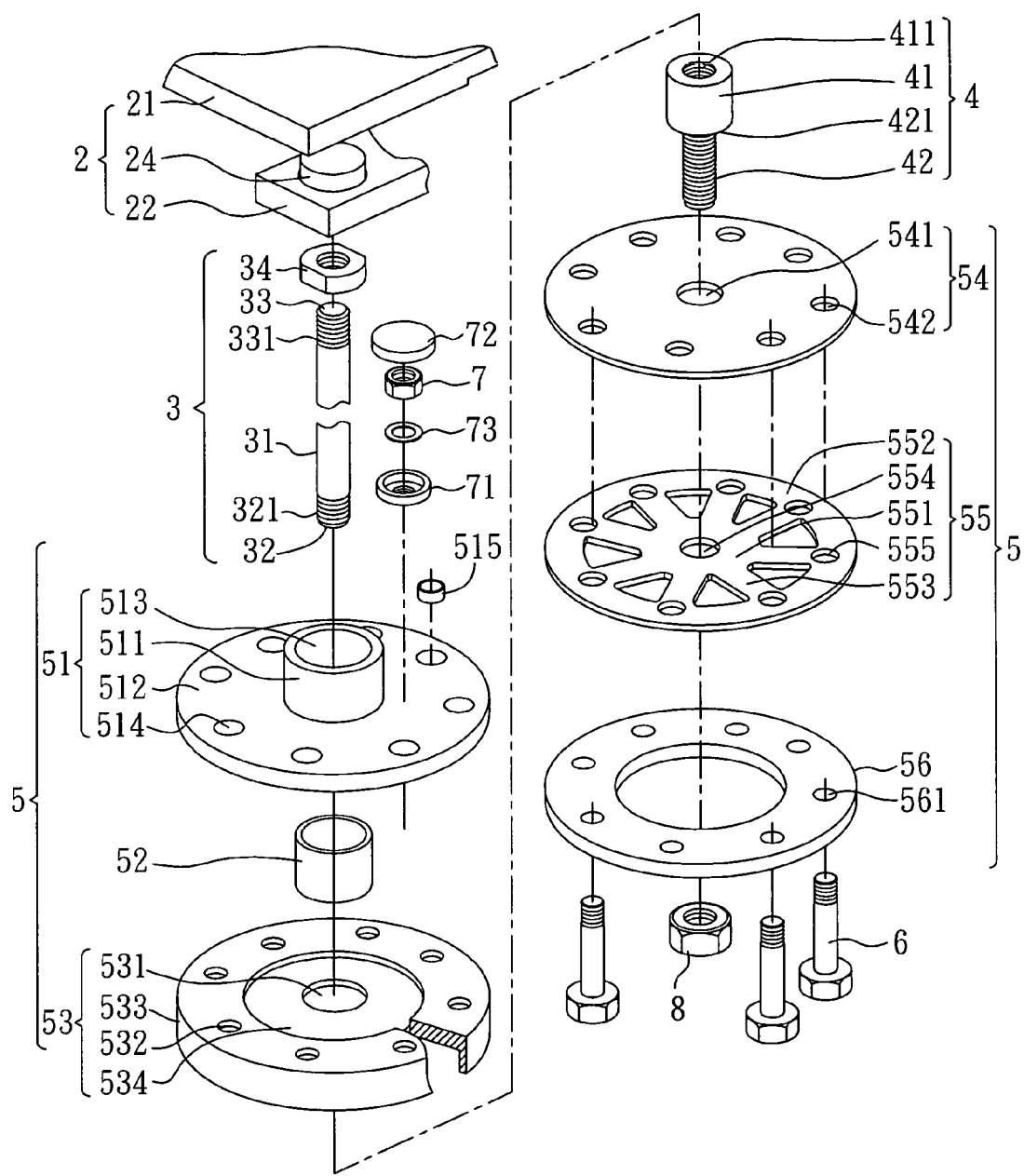
FIG. 4 is an exploded view illustrating the supporting table according to the first embodiment of the present invention.

References may further be made to FIGS. 3 and 4, a cross-sectional view illustrating the supporting table inside the crystal-growing furnace according to a first embodiment of the present invention and an exploded view illustrating the supporting table, wherein the supporting table 2 comprises a plurality of electric heaters 22 disposed, respectively, beneath the table plate 21. Each supporting post 3 includes a graphite electrode post 31, a metal electrode post 4, an anchoring base 5, a plurality of bolts 6, and a locking nut 8.

The graphite electrode post 31 has a bottom end 32 and a top end 33. The bottom end 32 is provided with an external thread 321 and the top end 33 with an external thread 331. The graphite electrode post 31 is also provided with an adjusting nut 34. Through threading engagement of the adjusting nut 34 with the external thread 331, underneath of the heater 22 is supported and that an electric connection therebetween is established. The adjusting nut 34 is provided not only for adjusting horizontal degree of the supporting table 2, but also for enlarging contacting area of electrical connection so as to reduce electric resistance thereof.

The metal electrode post 4 refers to a copper electrode post 4 including a nut portion 41 and a thread portion 42. The nut portion 41 is, at one end, provided with a recessed internal thread hole 411 for threading engagement, correspondingly, with the external thread 321 of the graphite electrode post 31. The nut portion 41 extends, at the other end, the thread portion 42 and forms, together with the thread portion 42, a shoulder portion 421.

As shown in FIGS. 3 and 4, the anchoring base 5 includes a flange 51, an insulating seal 52, an upper insulating pad 53, a sealing washer 54, an elastic washer 55, a ring 56, and eight insulating rings 515. The flange 51 is made of stainless steel, and has a cylindrical portion 511 and an external circular portion 512, wherein the cylindrical portion 511 is, at periphery, welded to the wall 121 of the lower body 12, such that a central hole 513 is formed in the cylindrical portion 511.

The external circular portion 512 is provided with eight extending holes 514. The insulating seal 52 is made of alumina fiber and is sleeved to the nut portion 41 of the metal electrode post 4, which are then received together into the central hole 513. The upper insulating pad 53 refers to a perpendicular-edge insulating pad, and is made of silicon rubber or Teflon. The upper insulating pad 53 has a central hole 531 and is provided with eight circular holes 532 along circumference thereof, where the upper insulating pad 53 is provided, circumferentially, with a flange 533 for sealing with the ring 56 and for enhancing insulating effectiveness. The sealing washer 54 refers to a copper washer, and has a central hole 541 and is, circumferentially, provided with eight passing holes 542.

The elastic washer 55 includes a center portion 551, a circumference portion 552, and eight elastic pieces 553 which are inter-connected with and between the center portion 551 and the circumference portion 552 so as to provide an elastic force in an axial direction and to provide equal loading for each supporting post 3. The center portion 551 is provided, at center, with a central hole 554, and that the circumference portion 552 with eight through holes 555.

The thread portion 42 of the metal electrode post 4 extends through the central hole 541 of the sealing washer 54 and the central hole 554 of the elastic washer 55, with the shoulder portion 421 abutting the sealing washer 54. The ring 56 is, circumferentially, provided with eight fixing holes 561.

Further, in the present embodiment, eight bolts 6 extend, correspondingly, through the eight fixing holes 561, the eight through holes 555, the eight passing holes 542, the eight circular holes 532, the eight extending holes 514, the eight insulating rings 515, eight insulating seals 71, and eight metal washers 73. And with the help of eight nuts 7, the upper insulating pad 53, the sealing washer 54 and the elastic washer 55 are clamped together and fastened in between the flange 51 and the ring 56, wherein electric insulation is established between the flange 51 and the sealing washer 54 attributed to the insulating seal 52, the upper insulating pad 53, and the eight insulating rings 515. In addition, eight insulating caps 72 are covered on the eight nuts 7 so as to prevent water drips from entering into gaps between the bolts 6 and the flange 51 and to enhance insulating effect.

Still further, the flange 51 and the ring 56 are made of stainless steel which is well conductive for cooling. Since the flange 51 and the ring 56 protrude outward from a bottom edge of the supporting post 3 and enlarge a cooling area, the insulating seal 52, the upper insulating pad 53 and the insulating rings 515 can be prevented from losing electric insulating effect due to being overheated and burnt in the furnace. And this will prevent the crystal-growing furnace 1 from causing public casualty in case of short circuit.

As shown in FIG. 3, the flange 51 is provided, underneath, with a protrusion ring 516, and that the upper insulating pad 53 is provided, on the top, with an annular recess 534, where the protrusion ring 516 is inserted into the annular recess 534 so as to effect an anchoring action and to stop a relative sliding between the flange 51 and the upper insulating pad 53.

The locking nut 8 is screwed to the thread portion 42 of the metal electrode post 4, and is provided for clamping the sealing washer 54 and the elastic washer 55 in between the locking nut 8 and the shoulder portion 421 of the metal electrode post 4. Whereas the remaining portion of the thread portion 42 is used for screwing to an external power source so as to provide electricity to the heater 22 in the crystal-growing furnace 1.

In the present invention, since there are more than three supporting posts 3, it is necessary to consider the problems of balanced loading and adjustment on horizontal degree for the supporting table 2. Therefore, with the help of the elasticity of the elastic washer 55 and the adjustment of the adjusting nut 34, the supporting table 2 bears an equal distribution of loading from the supporting posts 3, making increase of the number of the supporting posts 3 become immaterial.

In addition to distributing the weight of the supporting table 2 and to stably securing the supporting table 2 on the wall 121 of the lower body 12 of the crystal-growing furnace 1 so as to avoid public casualty because of falling down thereof, the table plate 21 of the supporting table 2 is provided, underneath, with a central recess 26. As such, the supporting table 2 is thinner in the center, not only increasing efficiency of heating for the heater 22, but also making the crystal-growing cooling process beginning from the center of the bottom of the crucible 20 and then crystal-growth proceeds upward and outward uniformly. This will avoid incurring of inner stress. Since the table plate 21 lowers its ability to accumulate heat, the heater 22 arranged beneath the table plate 21 can therefore uniformly and directly transfer, with high efficiency, heat to the crucible 20. In contrast, during the process of silicon slurry cooling, the crucible 20 can achieve a more effective cooling at the bottom of the crucible 20. This not only facilitates a uniform crystal growth for the silicon slurry, but also saves consumption of energy.

Now referring to FIG. 3, an insulating bias piece 24 is disposed between the heater 22 and the table plate 21, where the insulating bias piece 24 corresponds, downward, to the top of the graphite electrode post 31. Besides, the heater 22 is provided, at both sides, with a first receiving recess 25, respectively. A plurality of second receiving recesses 23 are provided underneath of the table plate 21, and that the insulating bias piece 24 is received in the first receiving recess 25 and the second receiving recess 23 which corresponds to the first receiving recess 25, such that the table plate 21 and the heater 22 can be held stably. The insulating bias piece 24 is made of zirconium oxide.

Figure 5:
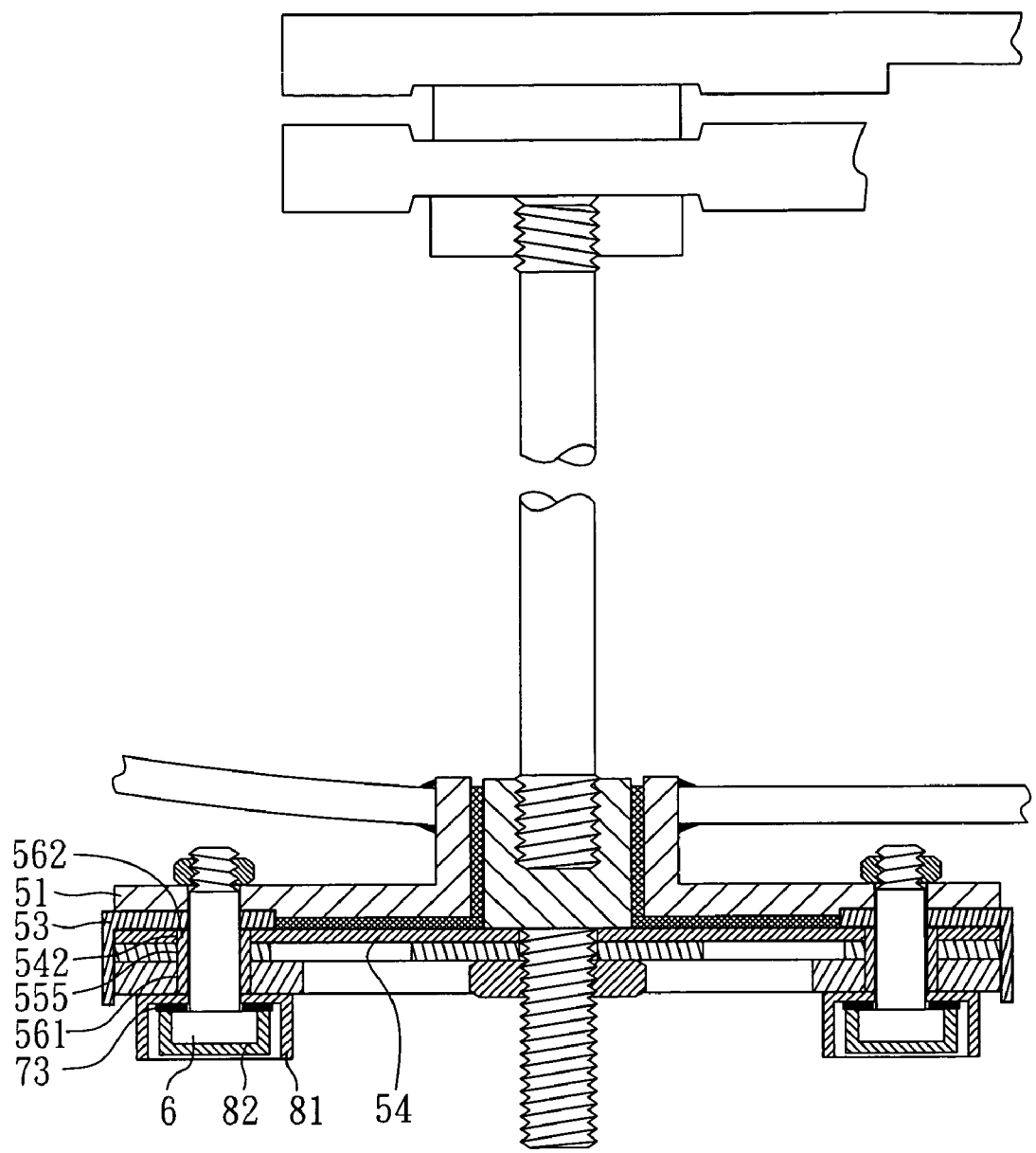
FIG. 5 is a cross-sectional view illustrating a supporting table taken along lines A-A in FIG. 2 according to a second embodiment of the present invention.

Referring to FIG. 5, a cross-sectional view illustrating a supporting table according to a second embodiment of the present invention, the second embodiment has a structure similar to that of the first embodiment, except that eight insulating seals 81 and eight insulating caps 82 are covered on heads of the bolts 6, respectively, and that a metal washer 73 is interposed between the head of the bolt 6 and the insulating seal 81. Another difference lies in that an insulating ring 562 extends through the fixing hole 561, the through hole 555 and the passing hole 542, and then seals tightly to and between underneath of the upper insulating pad 53 and top of the insulating seal 81 so as to effect electric insulation between the flange 51 and the sealing washer 54.

Figure 6:
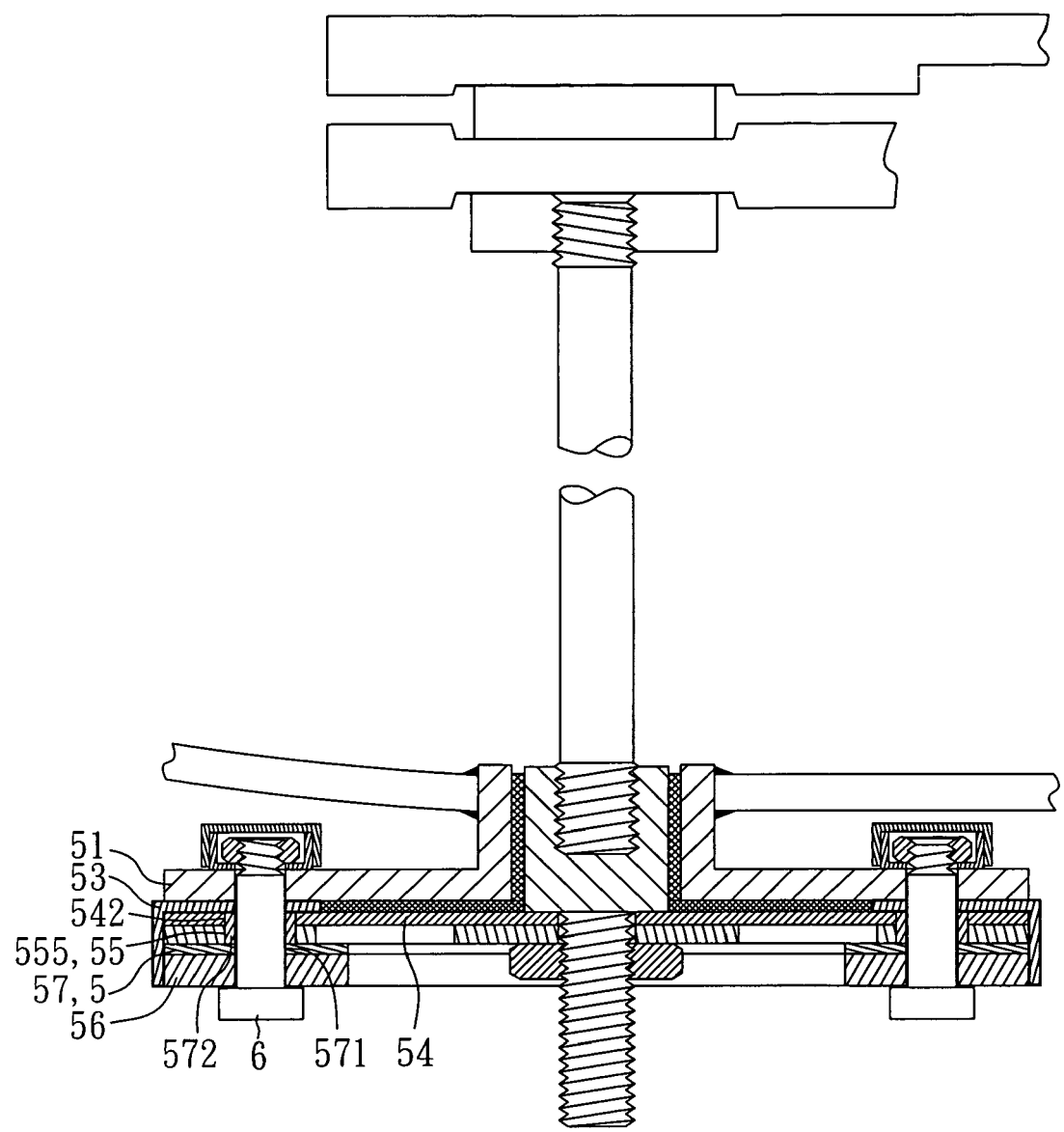
FIG. 6 is a cross-sectional view illustrating a supporting table taken along lines A-A in FIG. 2 according to a third embodiment of the present invention.

Further, referring to FIG. 6, a cross-sectional view illustrating a supporting table according to a third embodiment of the present invention, the third embodiment has a structure similar to that of the first embodiment, except that in the third embodiment the anchoring base 5 further includes a lower insulating pad 57 interposed between the elastic washer 55 and the ring 56. The lower insulating pad 57 is provided, circumferentially, with eight through holes 571 for passing therethrough the bolts 6. Another difference in structure is that insulating holes 572 each passes through the through hole 555 and the passing hole 542, and then seals tightly to and between underneath of the upper insulating pad 53 and top of the lower insulating pad 57 so as to effect electric insulation between the flange 51 and the sealing washer 54.

Although the present invention has been explained in relation to its preferred embodiments, it is to be understood that many other possible modifications and variations can be made without departing from the scope of the invention as hereinafter claimed.

What is claimed is:

1. A supporting table having heaters inside a crystal-growing furnace, comprising a table plate and at least four supporting posts, wherein the table plate is supported by and fixed to the wall of a lower body of the crystal-growing furnace by the at least four supporting posts;

characterized in that:

the supporting table further comprises a plurality of electric heaters disposed, respectively, beneath the table plate, wherein each supporting post includes:

a graphite electrode post, including a bottom end and a top end, wherein the bottom end is provided with an external thread, the top end supports one of the heaters against underneath of the heater so as to establish an electric connection therebetween;

a metal electrode post, including a nut portion and a thread portion, wherein the nut portion is, at one end, provided with a recessed internal thread hole for threading engagement, correspondingly, with the external thread of the graphite electrode post, and the nut portion extends, at the other end, the thread portion and forms, together with the thread portion, a shoulder portion;

an anchoring base, including a flange, an insulating seal, an upper insulating pad, a sealing washer, an elastic washer, a ring, and a plurality of insulating rings, wherein the flange has a cylindrical portion and an external circular portion, the cylindrical portion is, at periphery, fixed to the wall of the lower body of the furnace, such that a central hole is formed in the cylindrical portion, and the external circular portion is provided with a plurality of through holes; and wherein the insulating seal is sleeved to the nut portion of the metal electrode post, which are then received together into the central hole; and wherein the upper insulating pad has a central hole and is provided with a plurality of circular holes alone circumference thereof; and wherein the sealing washer has a central hole and is, circumferentially, provided with a plurality of passing holes; and wherein the elastic washer includes a center portion, a circumference portion, and at least one elastic piece which is inter-connected with and between the center portion and the circumference portion so as to provide an elastic force in an axial direction, the center portion is provided, at center, with a central hole, and at the circumference portion with a plurality of through holes; and wherein the thread portion of the metal electrode post extends through the central hole of the sealing washer and the central hole of the elastic washer, with the shoulder portion abutting the sealing washer, and the ring is, circumferentially, provided with a plurality of fixing holes;

a plurality of bolts, extending, correspondingly, through the plural fixing holes, the plural insulating rings, the plural through holes, the plural passing holes, the plural circular holes, and the plural extending holes, and with the help of plural nuts, the upper insulating pad, the sealing washer and the elastic washer are clamped together and fastened in between the flange and the ring, wherein electric insulation is established between the flange and the sealing washer attributed to the insulating seal, the upper insulating pad, and the plural insulating rings; and a locking nut, being screwed to the thread portion of the metal electrode post, and being provided for clamping the sealing washer and the elastic washer in between the locking nut and the shoulder portion of the metal electrode post.

2. The supporting table as claimed in claim 1, wherein an insulating bias piece is disposed between the heater and the table plate, and the insulating bias piece corresponds, downward, to the top of the graphite electrode post.

3. The supporting table as claimed in claim 2, wherein the heater is provided, at both sides, with a first receiving recess, respectively, and a plurality of second receiving recesses are provided underneath of the table plate, and the insulating bias piece is received in the first receiving recess and the second receiving recess which corresponds to the first receiving recess.

4. The supporting table as claimed in claim 2, wherein the insulating bias piece is made of zirconium oxide.

5. The supporting table as claimed in claim 1, wherein the table plate is provided, underneath, with a central recess.

6. The supporting table as claimed in claim 1, wherein the graphite electrode post has a top end on which an external thread is provided, and the graphite electrode post further has an adjusting nut, and through threading engagement of the adjusting nut with the external thread the heater is supported.

7. The supporting table as claimed in claim 6, wherein the adjusting nut is a graphite adjusting nut.

8. The supporting table as claimed in claim 1, wherein the metal electrode post is a copper electrode post.

9. The supporting table as claimed in claim 1, wherein the flange is provided, underneath, with a protrusion ring, and the upper insulating pad is provided, on the top, with an annular recess, where the protrusion ring is inserted into the annular recess.

10. The supporting table as claimed in claim 1, wherein the flange is made of stainless steel.

11. The supporting table as claimed in claim 1, wherein the insulating seal is made of alumina fiber.

12. The supporting table as claimed in claim 1, wherein the upper insulating pad is made of silicon rubber.

13. The supporting table as claimed in claim 1, wherein the upper insulating pad is made of Teflon.

14. The supporting table as claimed in claim 1, wherein the upper insulating pad is provided, circumferentially, with a flange.

15. The supporting table as claimed in claim 1, wherein the sealing washer is a copper washer.

16. The supporting table as claimed in claim 1, wherein the anchoring base further includes a lower insulating pad interposed between the elastic washer and the ring, and the lower insulating pad is provided, circumferentially, with a plurality of holes.

17. The supporting table as claimed in claim 1, further comprising a plurality of insulating seals and of insulating caps which are covered, correspondingly, on the plural nuts, respectively.

18. The supporting table as claimed in claim 1, further comprising a plurality of insulating seals and of insulating caps which are covered, correspondingly, on heads of the plural bolts, respectively.

* * * * *